(12) United States Patent
Ozasa

(10) Patent No.: US 10,715,111 B2
(45) Date of Patent: Jul. 14, 2020

(54) ELASTIC WAVE FILTER DEVICE AND DUPLEXER

(71) Applicant: Murata Manufacturing Co., Ltd., Nagaokakyo-shi, Kyoto-fu (JP)

(72) Inventor: Motoki Ozasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 71 days.

(21) Appl. No.: 16/004,462

(22) Filed: Jun. 11, 2018

(65) Prior Publication Data

US 2018/0294797 A1    Oct. 11, 2018

Related U.S. Application Data

(63) Continuation of application No. PCT/JP2016/089199, filed on Dec. 28, 2016.

(30) Foreign Application Priority Data

Dec. 28, 2015  (JP) ................................. 2015-257540

(51) Int. Cl.
  *H03H 9/64* (2006.01)
  *H03H 9/72* (2006.01)
  (Continued)

(52) U.S. Cl.
  CPC ...... *H03H 9/6489* (2013.01); *H03H 9/02559* (2013.01); *H03H 9/02984* (2013.01);
  (Continued)

(58) Field of Classification Search
  CPC .... H03H 9/6489; H03H 9/725; H03H 9/6483; H03H 9/25; H03H 9/14541;
  (Continued)

(56) References Cited

U.S. PATENT DOCUMENTS 6,351,194 B2 * 2/2002 Takahashi ............ H03H 9/0576
  174/262
7,456,544 B2 * 11/2008 Kando ................. H03H 9/0222
  310/313 B (Continued)

FOREIGN PATENT DOCUMENTS

| JP | 2005-124139 A | 5/2005 |
| JP | 2010-021718 A | 1/2010 |
| JP | 2015-070489 A | 4/2015 |

OTHER PUBLICATIONS

Official Communication issued in International Patent Application No. PCT/JP2016/089199, dated Mar. 21, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave filter device includes first and second reception filters, an input terminal, output terminals, and reference terminals provided on a piezoelectric substrate. The first reception filter includes series resonators and parallel resonators, and the second reception filter includes series resonators and parallel resonators. The reference terminal connected to the parallel resonator connected so as to be closest to the output terminal among the parallel resonators included in the first reception filter, and the reference terminal connected to the parallel resonator connected so as to be closest to the output terminal among the parallel resonators included in the second reception filter, are separated from each other on the piezoelectric substrate.

20 Claims, 11 Drawing Sheets

(51) Int. Cl.
  *H03H 9/02*     (2006.01)
  *H03H 9/145*    (2006.01)
  *H03H 9/25*     (2006.01)
  *H01L 41/047*   (2006.01)
  *H01L 41/053*   (2006.01)

(52) U.S. Cl.
  CPC .......... *H03H 9/14541* (2013.01); *H03H 9/25* (2013.01); *H03H 9/6483* (2013.01); *H03H 9/725* (2013.01); *H01L 41/0477* (2013.01); *H01L 41/0533* (2013.01)

(58) Field of Classification Search
  CPC ............ H03H 9/02984; H03H 9/02559; H01L 41/0533; H01L 41/0477
  USPC .......................................... 333/133, 193–196
  See application file for complete search history.

(56) References Cited

U.S. PATENT DOCUMENTS

| | | | |
|---|---|---|---|
| 2005/0070332 A1 | 3/2005 | Yamato | |
| 2005/0264375 A1* | 12/2005 | Ikuta | H03H 9/725 333/133 |
| 2009/0302970 A1* | 12/2009 | Hatano | H03H 9/0571 333/133 |
| 2010/0007435 A1 | 1/2010 | Kawamoto et al. | |
| 2013/0328640 A1* | 12/2013 | Tsutsumi | H03H 7/463 333/133 |

\* cited by examiner

COMPARATIVE EXAMPLE

ELASTIC WAVE FILTER DEVICE AND DUPLEXER

CROSS REFERENCE TO RELATED APPLICATIONS

This application claims the benefit of priority to Japanese Patent Application No. 2015-257540 filed on Dec. 28, 2015 and is a Continuation Application of PCT Application No. PCT/JP2016/089199 filed on Dec. 28, 2016. The entire contents of each application are hereby incorporated herein by reference.

BACKGROUND OF THE INVENTION

1. Field of the Invention

The present invention relates to an elastic wave filter device including a plurality of elastic wave filters, and a duplexer.

2. Description of the Related Art

Hitherto, an elastic wave filter using an elastic wave has been widely used as a band pass filter disposed at a front end portion of a mobile communication device, and the like. In addition, an elastic wave filter device including a plurality of elastic wave filters in order to support composite feature, such as a multimode/multiband feature, has been put into practical use.

Japanese Unexamined Patent Application Publication No. 2005-124139 discloses the configuration of a demultiplexer including two ladder surface acoustic wave filters having frequencies different from each other. FIG. 13 is a block diagram of a demultiplexer 800 disclosed in Japanese Unexamined Patent Application Publication No. 2005-124139. The demultiplexer 800 includes a transmission filter 803 and a reception filter 804. The transmission filter 803 is a ladder surface acoustic wave filter that is disposed between an antenna terminal 801 and a transmission input terminal 805 and that is formed of three series resonators and two parallel resonators. The reception filter 804 is a ladder surface acoustic wave filter that is disposed between the antenna terminal 801 and a reception output terminal 806 and that is formed of two series resonators and three parallel resonators. In addition, a matching circuit 802 is provided at the antenna terminal 801 side. The two parallel resonators of the transmission filter 803 are shared at an ground terminal 803c, the three parallel resonators of the reception filter 804 are shared at an ground terminal 804c, and the ground terminal 803c and the ground terminal 804c are shared by a shared inductance component 809 and thus shunted to one ground. Due to the above configuration, it is possible to save the area of a ground electrode of each filter, and thus it is possible to reduce the size of the demultiplexer 800.

However, when all ground terminals for parallel resonators are shared over a plurality of filters for size reduction as in the above-described known demultiplexer, there are problems in that a signal leaks between the filters via the ground terminal and the attenuation characteristics outside the pass bands of the filters deteriorate.

SUMMARY OF THE INVENTION

Preferred embodiments of the present invention provide elastic wave filter devices and duplexers that are reduced in size while an attenuation outside the pass band thereof is ensured.

An elastic wave filter device according to a preferred embodiment of the present invention includes a first elastic wave filter and a second elastic wave filter having pass bands that are different from each other and provided on a piezoelectric substrate; and a shared terminal, a first terminal, a second terminal, and a plurality of reference terminals provided on the piezoelectric substrate, wherein the first elastic wave filter includes a series resonator connected between the shared terminal and the first terminal and a parallel resonator connected between a connection path from the shared terminal to the first terminal and one reference terminal among the plurality of reference terminals, the second elastic wave filter includes parallel resonators connected between a connection path from the shared terminal to the second terminal and another reference terminal among the plurality of reference terminals, and a first reference terminal connected to a parallel resonator connected so as to be closest to the first terminal among the parallel resonators included in the first elastic wave filter, and a second reference terminal connected to a parallel resonator connected so as to be closest to the second terminal among the parallel resonators included in the second elastic wave filter, are separated from each other on the piezoelectric substrate.

Accordingly, since the two elastic wave filters are provided on the single piezoelectric substrate, it is possible to reduce the size of the elastic wave filter device. Here, to achieve further size reduction, the reference terminals connected to the parallel resonators are shared on the piezoelectric substrate as much as possible. However, by sharing the reference terminal, an unnecessary path for a high-frequency signal via the reference terminal is provided, resulting in deterioration of an attenuation outside the pass band.

In the above-described configuration, the reference terminals connected to the parallel resonators closest to the first terminal and the second terminal that are input/output terminals are separated from each other on the piezoelectric substrate. Therefore, an unnecessary shortest path for a high-frequency signal is not provided between the first terminal and the second terminal, so that it is possible to effectively reduce or prevent the occurrence of leaking of a signal between the filters. Accordingly, it is possible to reduce the influence on the attenuation in an opposite-side band. Thus, it is possible to obtain an elastic wave filter device that is reduced in size while an attenuation outside a pass band is ensured.

Each of the first reference terminal and the second reference terminal may preferably be separated on the piezoelectric substrate from any of the other reference terminals on the piezoelectric substrate.

Accordingly, an unnecessary shortest path for a high-frequency signal via the first reference terminal and the second reference terminal is blocked between the first terminal and the second terminal, and thus it is possible to more effectively reduce or prevent the occurrence of leaking of a signal between the filters. Thus, it is possible to reduce the influence on the attenuation in the opposite-side band.

The first reference terminal may preferably be separated on the piezoelectric substrate from any of the reference terminals connected to the parallel resonators included in the second elastic wave filter, and the second reference terminal may be separated on the piezoelectric substrate from any of the reference terminal connected to the parallel resonators included in the first elastic wave filter.

Accordingly, in addition to an unnecessary shortest path for a high-frequency signal via the first reference terminal and the second reference terminal, a signal path via the first reference terminal and the reference terminal of the second elastic wave filter and a signal path via the second reference terminal and the reference terminal of the first elastic wave filter are blocked between the first terminal and the second terminal, and thus it is possible to more effectively reduce or prevent the occurrence of leaking of a signal between the filters. Thus, it is possible to reduce the influence on the attenuation in the opposite-side band.

At least one set among the plurality of reference terminals may preferably be shared on the piezoelectric substrate.

Accordingly, since the two or more reference terminals are shared on the piezoelectric substrate, it is possible to reduce the area of the piezoelectric substrate while blocking an unnecessary path for a high-frequency signal provided by the shortest distance via the first reference terminal and the second reference terminal. Thus, it is possible to obtain an elastic wave filter device that is reduced in size while a required attenuation outside a pass band is ensured.

The reference terminals other than the first reference terminal and the second reference terminal, among the plurality of reference terminals, may preferably be shared on the piezoelectric substrate.

Accordingly, since all of the reference terminals other than the first reference terminal and the second reference terminal are shared on the piezoelectric substrate, it is possible to most effectively reduce the area of the piezoelectric substrate while blocking an unnecessary shortest path for a high-frequency signal. Therefore, it is possible to obtain an elastic wave filter device that is reduced in size while a required attenuation outside a pass band is ensured.

The first elastic wave filter may preferably be a reception filter that filters a high-frequency signal input through the shared terminal, in a first pass band and outputs the filtered signal to the first terminal, and the second elastic wave filter may preferably be a reception filter that filters a high-frequency signal input through the shared terminal, in a second pass band and outputs the filtered signal to the second terminal.

Accordingly, it is possible to obtain a dual filter or a multiplexer that is reduced in size while sufficiently ensuring an attenuation outside the pass band (in the pass band of a reception filter at the opposite side).

The first elastic wave filter and the second elastic wave filter may preferably be ladder surface acoustic wave filters.

Each ladder surface acoustic wave filter includes a plurality of series resonators and a plurality of parallel resonators, and separating or sharing the reference terminals connected to the respective resonators influences the bandpass characteristics. In addition, since each of the first elastic wave filter and the second elastic wave filter is a ladder surface acoustic wave filter, a piezoelectric substrate having the same acoustic velocity, electromechanical coupling coefficient, and other characteristics is able to be used for the first and second elastic wave filters, so that it is possible to provide these filters in one chip.

Accordingly, it is possible to achieve size reduction while sufficiently ensuring the attenuation in the opposite-side band.

A duplexer according to a preferred embodiment of the present invention includes the above-described elastic wave filter device, wherein the first elastic wave filter is one of a reception filter that filters a high-frequency signal input through the shared terminal, in a first pass band and outputs the filtered signal to the first terminal and a transmission filter that filters a high-frequency signal inputted through the second terminal, in a second pass band and outputs the filtered signal to the shared terminal, and the second elastic wave filter is the other of the reception filter and the transmission filter.

Accordingly, it is possible to obtain a duplexer that is reduced in size while sufficiently ensuring an attenuation in the pass band of an opposite-side filter.

With the elastic wave filter devices and the duplexers according to preferred embodiments of the present invention, it is possible to achieve size reduction while ensuring the attenuation outside the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
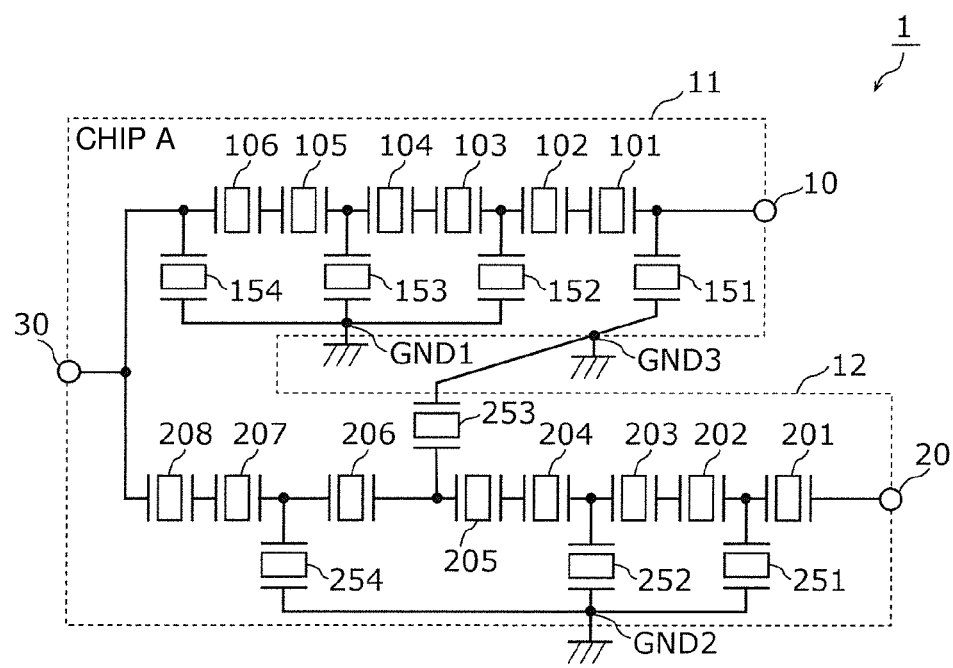
FIG. 1 is a circuit configuration diagram of an elastic wave filter device according to Preferred Embodiment 1 of the present invention.

Hereinafter, preferred embodiments of the present invention will be described in detail using examples and drawings thereof. The preferred embodiments described below each illustrate a comprehensive or specific example. Numerical values, shapes, materials, elements, the arrangement and the connection configuration of the elements, and other features described in the following preferred embodiments are merely examples, and are not intended to limit the present invention. Among the elements in the following preferred embodiments, elements that are not described in the independent claim are described as optional elements. The sizes of elements shown in the drawings and the ratio of the sizes are not necessarily precise.

Preferred Embodiment 1

In the present preferred embodiment, a dual filter that is preferably used for Band34 (reception pass band: 2010 MHz to 2025 MHz) and Band40A (reception pass band: 2300 MHz to 2370 MHz), for example, complying with TD-LTE (Time Division Long Term Evolution) standards is described.

FIG. 1 is a circuit configuration diagram of an elastic wave filter device 1 according to Preferred Embodiment 1. As shown in FIG. 1, the elastic wave filter device 1 includes reception filters 11 and 12, output terminals 10 and 20, and an input terminal 30.

The reception filter 11 is a ladder first elastic wave filter that includes series resonators 101, 102, 103, 104, 105, and 106 connected between the input terminal 30 (shared terminal) and the output terminal 10 (first terminal) and parallel resonators 151, 152, 153, and 154 connected between a connection path from the input terminal 30 to the output terminal 10 and one reference terminal of a plurality of reference terminals, respectively. The series resonators 101 to 106 and the parallel resonators 151 to 154 are each preferably a surface acoustic wave resonator, for example. The reception filter 11 is an unbalanced input-unbalanced output band pass filter that receives a received wave input through the input terminal 30, filters the received wave in the reception pass band of Band34, and outputs the filtered wave to the output terminal 10.

The reception filter 12 is a ladder second elastic wave filter that includes series resonators 201, 202, 203, 204, 205, 206, 207, and 208 connected between the input terminal 30 and the output terminal 20 (second terminal) and parallel resonators 251, 252, 253, and 254 connected between a connection path from the input terminal 30 to the output terminal 20 and another reference terminal of the plurality of reference terminals. The series resonators 201 to 208 and the parallel resonators 251 to 254 are each preferably a surface acoustic wave resonator, for example. The reception filter 12 is an unbalanced input-unbalanced output band pass filter that receives a received wave input through the input terminal 30, filters the received wave in the reception pass band of Band40A, and outputs the filtered wave to the output terminal 20.

In addition, the input terminal 30 is connected to an antenna element or an antenna switch, for example, and the output terminals 10 and 20 are connected to a LNA (Low Noise Amplifier), for example. Due to this connection configuration, the elastic wave filter device 1 outputs a high-frequency signal received by the antenna element, selectively to the output terminal 10 or 20 in accordance with the frequency band of the high-frequency signal.

Here, the structures of the surface acoustic wave resonators of the reception filters 11 and 12 will be described.

Figure 2:
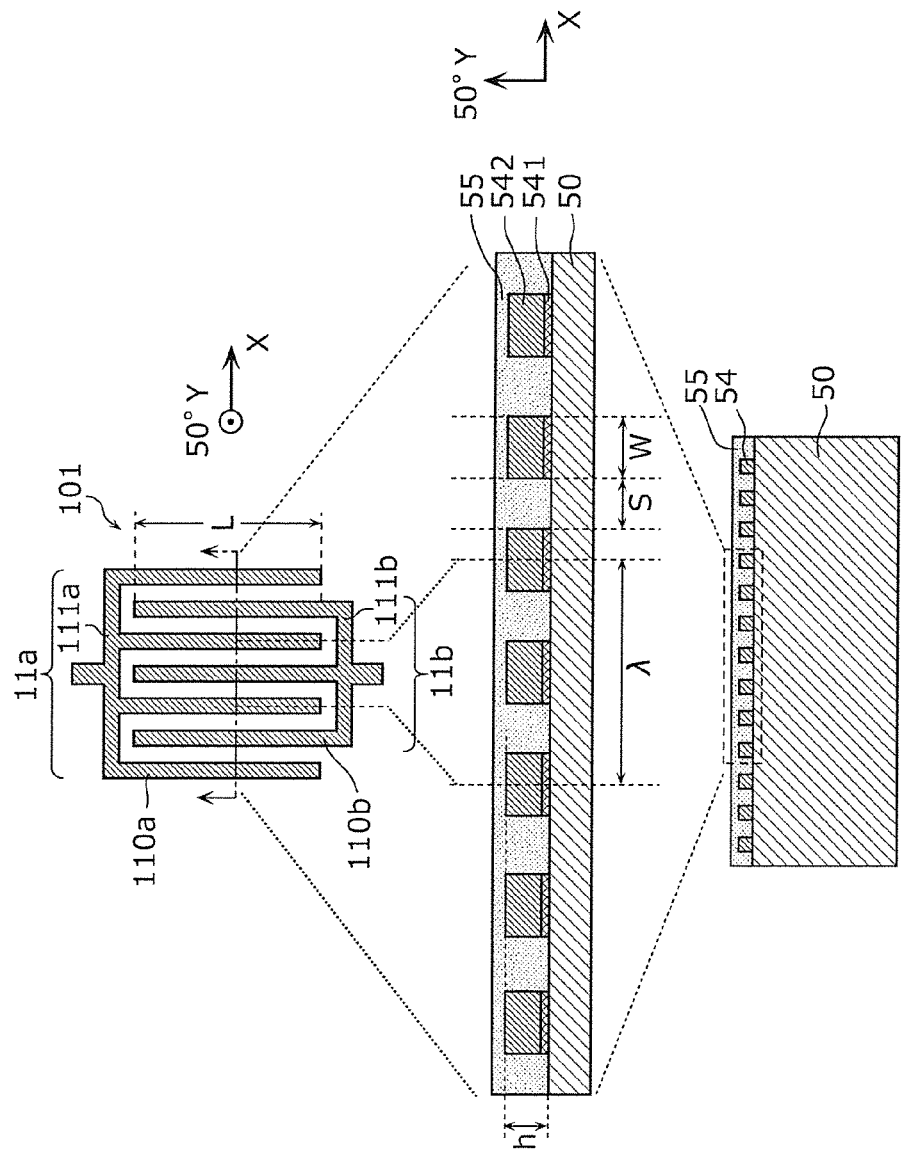
FIG. 2 is an example of a plan view and a cross-sectional view schematically representing a resonator of a surface acoustic wave filter according to a preferred embodiment of the present invention.

FIG. 2 is an example of a plan view and a cross-sectional view schematically representing a resonator of the surface acoustic wave filter according to the present preferred embodiment. FIG. 2 illustrates a schematic plan view and a schematic cross-sectional view representing the structure of the series resonator 101 of the reception filter 11 among the plurality of resonators of the reception filters 11 and 12. The series resonator shown in FIG. 2 is for illustrating a typical structure of the plurality of resonators, and the number, the lengths, and other parameters of electrode fingers defining an electrode are not limited thereto.

Each resonator of the reception filters 11 and 12 includes a piezoelectric substrate 50 and IDT (Interdigital Transducer) electrodes 11a and 11b having a comb shape.

As shown in the plan view in FIG. 2, the pair of IDT electrodes 11a and 11b opposed to each other are provided on the piezoelectric substrate 50. The IDT electrode 11a includes a plurality of electrode fingers 110a that are parallel or substantially parallel to each other and a busbar electrode 111a connecting the plurality of electrode fingers 110a. In addition, the IDT electrode 11b includes a plurality of electrode fingers 110b that are parallel or substantially parallel to each other and a busbar electrode 111b connecting the plurality of electrode fingers 110b. The pluralities of electrode fingers 110a and 110b are disposed along a direction orthogonal or substantially orthogonal to an X-axis direction.

Moreover, an IDT electrode 54 including the pluralities of electrode fingers 110a and 110b and the busbar electrodes 111a and 111b preferably have a multilayer structure, for example, including a close contact layer 541 and a main electrode layer 542 as shown in the cross-sectional view in FIG. 2.

The close contact layer 541 is a layer that improves the adhesion between the piezoelectric substrate 50 and the main electrode layer 542, and, for example, Ti is preferably used as the material thereof. The film thickness of the close contact layer 541 is preferably, for example, about 12 nm.

For example, Al including about 1% of Cu is preferably used as the material of the main electrode layer 542. The film thickness of the main electrode layer 542 is preferably, for example, about 162 nm.

A protective layer 55 covers the IDT electrodes 11a and 11b. The protective layer 55 preferably, for example, protects the main electrode layer 542 from the external environment, adjusts frequency-temperature characteristics, and improves moisture resistance, and is a film including silicon dioxide as a main component, for example.

The materials of the close contact layer 541, the main electrode layer 542, and the protective layer 55 are not limited to the above-described materials. Furthermore, the IDT electrode 54 may not have the above-described multilayer structure. The IDT electrode 54 may be made a metal, such as Ti, Al, Cu, Pt, Au, Ag, and Pd, or an alloy thereof, or may be made of a plurality of multilayer bodies each made of the above metal or alloy, for example. In addition, the protective layer 55 may not be provided.

The piezoelectric substrate 50 is preferably made of, for example, 50° Y-cut X-propagation $LiTaO_3$ piezoelectric single crystal or piezoelectric ceramics (lithium tantalite single crystal that is cut by a plane having a normal line that is an axis rotated 50° from a Y axis about an X axis and in which a surface acoustic wave propagates in the X-axis direction, or ceramics).

Design parameters of an IDT electrode will now be described. The wavelength of the surface acoustic wave resonator is specified by a repeating pitch λ of the pluralities of electrode fingers 110a and 110b of the IDT electrodes 11a and 11b shown at the middle portion in FIG. 2. In addition, the overlap width L of the IDT electrode is an electrode finger length by which the electrode fingers 110a of the IDT electrode 11a and the electrode fingers 110b of the IDT electrode 11b overlap each other when seen from the X-axis direction, as shown at the upper portion in FIG. 2. In addition, a pair number is the number of the plurality of electrode fingers 110a or 110b.

The structure of each surface acoustic wave filter included in the elastic wave filter device according to the present preferred embodiment of the present invention is not limited to the structure shown in FIG. 2. For example, the IDT electrode 54 may not have a multilayer structure of metal films and may be a single layer of a metal film.

The operating principle of the ladder surface acoustic wave filter according to the present preferred embodiment will be described.

Each of the parallel resonators 151 to 154 shown in FIG. 1 has a resonant frequency frp and an anti-resonant frequency fap (>frp) in the resonance characteristics. In addition, each of the series resonators 101 to 106 has a resonant frequency frs and an anti-resonant frequency fas (>frs>frp) in the resonance characteristics. The resonant frequencies frs of the series resonators 101 to 106 are preferably equal or substantially equal to each other, but do not necessarily need to be equal or substantially equal to each other. In addition, the same applies to the anti-resonant frequencies fas of the series resonators 101 to 106, the resonant frequencies frp of the parallel resonators 151 to 154, and the anti-resonant frequencies fap of the parallel resonators 151 to 154, and the anti-resonant frequencies fas of the series resonators 101 to 106, the resonant frequencies frp of the parallel resonators 151 to 154, and the anti-resonant frequencies fap of the parallel resonators 151 to 154 do not necessarily need to be equal or substantially equal to each other.

In order to define a band pass filter using ladder resonators, the anti-resonant frequencies fap of the parallel resonators 151 to 154 and the resonant frequencies frs of the series resonators 101 to 106 are set to be close to each other. Accordingly, the vicinities of the resonant frequencies frp in which the impedances of the parallel resonators 151 to 154 become close to 0 are a low-frequency side stop region. In addition, when the frequency further increases therefrom, the impedances of the parallel resonators 151 to 154 increase in the vicinities of the anti-resonant frequencies fap, and the impedances of the series resonators 101 to 106 become close to 0 in the vicinities of the resonant frequencies frs. Accordingly, in a signal path from the input terminal 30 to the output terminal 10, the vicinities of the anti-resonant frequencies fap to the resonant frequencies frs are a signal pass region. Furthermore, when the frequency increases to be in the vicinities of the anti-resonant frequencies fas, the impedances of the series resonators 101 to 106 increase, and a high-frequency side stop region is provided.

In the reception filter 11, when a high-frequency signal is input through the input terminal 30, a potential difference is created between the input terminal 30 and the reference terminal, and accordingly, the piezoelectric substrate 50 becomes distorted, such that a surface acoustic wave propagating in the X direction is generated. Here, by making the pitch λ of the IDT electrodes 11a and 11b equal or substantially equal to the wavelength of the pass band, only a high-frequency signal having a frequency component that is desired to pass through the reception filter 11 passes through the reception filter 11.

Figure 3:
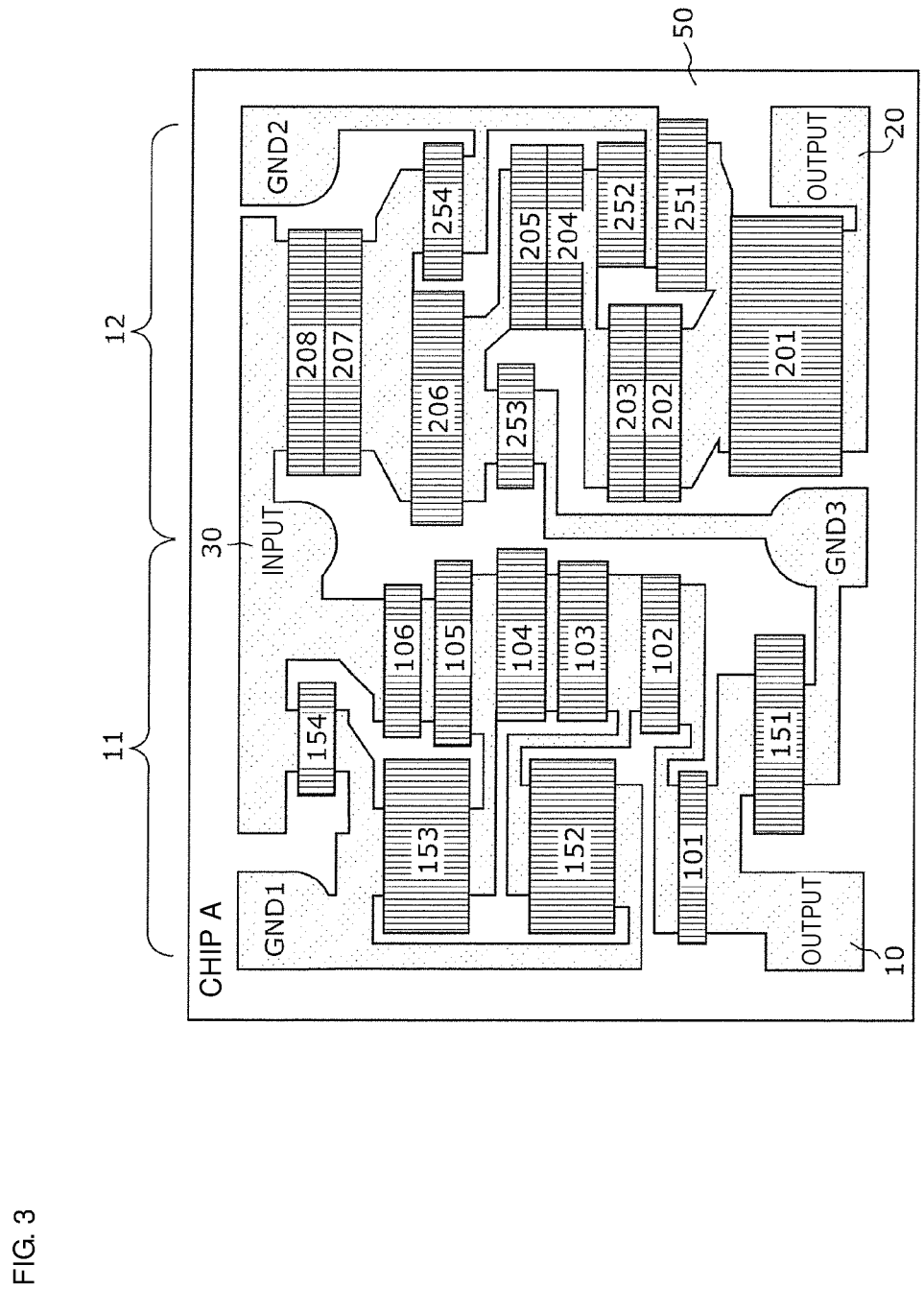
FIG. 3 is a chip layout diagram of the elastic wave filter device according to Preferred Embodiment 1 of the present invention.

FIG. 3 is a chip layout diagram of the elastic wave filter device 1 according to Preferred Embodiment 1. In FIG. 3, the configuration of the electrode layout of the reception filters 11 and 12 provided on the surface of the single piezoelectric substrate 50 is represented.

In FIG. 3, the reception filter 11 is disposed at the left half of the piezoelectric substrate 50, and the reception filter 12 is disposed at the right half of the piezoelectric substrate 50. The respective resonators shown in FIG. 1 are disposed such that directions in which a high-frequency signal propagates (right-left directions in FIG. 3) coincide with each other. In addition, an electrode wire electrically connecting each resonator, the input terminal 30, and the output terminals 10 and 20 is provided on the piezoelectric substrate 50 such that the circuit configuration shown in FIG. 1 is achieved. The material used for the electrode wire is preferably the same as the material used for each resonator (the IDT electrode 54 in FIG. 2).

In addition to the input terminal 30 and the output terminals 10 and 20, reference terminals GND1, GND2, and GND3 are disposed on the piezoelectric substrate 50 shown in FIG. 3. The reference terminals GND1, GND2, and GND3 are separated from each other on a chip A of the piezoelectric substrate 50 and are grounded outside the chip A via external wires. In the present preferred embodiment, the reference terminal GND1 is connected to the parallel resonators 152, 153, and 154, the reference terminal GND2 is connected to the parallel resonators 251, 252, and 254, and the reference terminal GND3 is connected to the parallel resonators 151 and 253.

An elastic wave filter device including a plurality of elastic wave filters to support composite features, such as a multimode/multiband feature, is required to be reduced in size. On the other hand, in the elastic wave filter device 1 according to the present preferred embodiment, the reception filters 11 and 12 are provided on the single piezoelectric substrate 50 as shown in FIG. 3, and thus, it is possible to reduce the size of the elastic wave filter device 1.

Here, to achieve further size reduction, the reference terminals connected to the parallel resonators are preferably shared on the piezoelectric substrate 50 as much as possible. However, there is a concern that by sharing the reference terminal, an unnecessary path for a high-frequency signal via the reference terminal with the shortest distance is provided, which results in deterioration of the attenuation outside the pass band.

On the other hand, in the chip layout shown in FIG. 3, the reference terminal GND3 (first reference terminal) connected to the parallel resonator 151 connected so as to be closest to the output terminal 10 among the parallel resonators included in the reception filter 11, and the reference terminal GND2 (second reference terminal) connected to the parallel resonator 251 connected so as to be closest to the output terminal 20 among the parallel resonators included in the reception filter 12, are separated from each other on the single piezoelectric substrate 50. That is, the reference terminals GND3 and GND2 connected to the parallel resonators 151 and 251 closest to the output terminals are insulated from each other on the piezoelectric substrate 50. Therefore, an unnecessary path for a high-frequency signal between the output terminal 10 and the output terminal 20 with the shortest distance is not provided, so that it is possible to effectively reduce or prevent the occurrence of leaking of a signal between the reception filter 11 and the reception filter 12.

Figure 4:
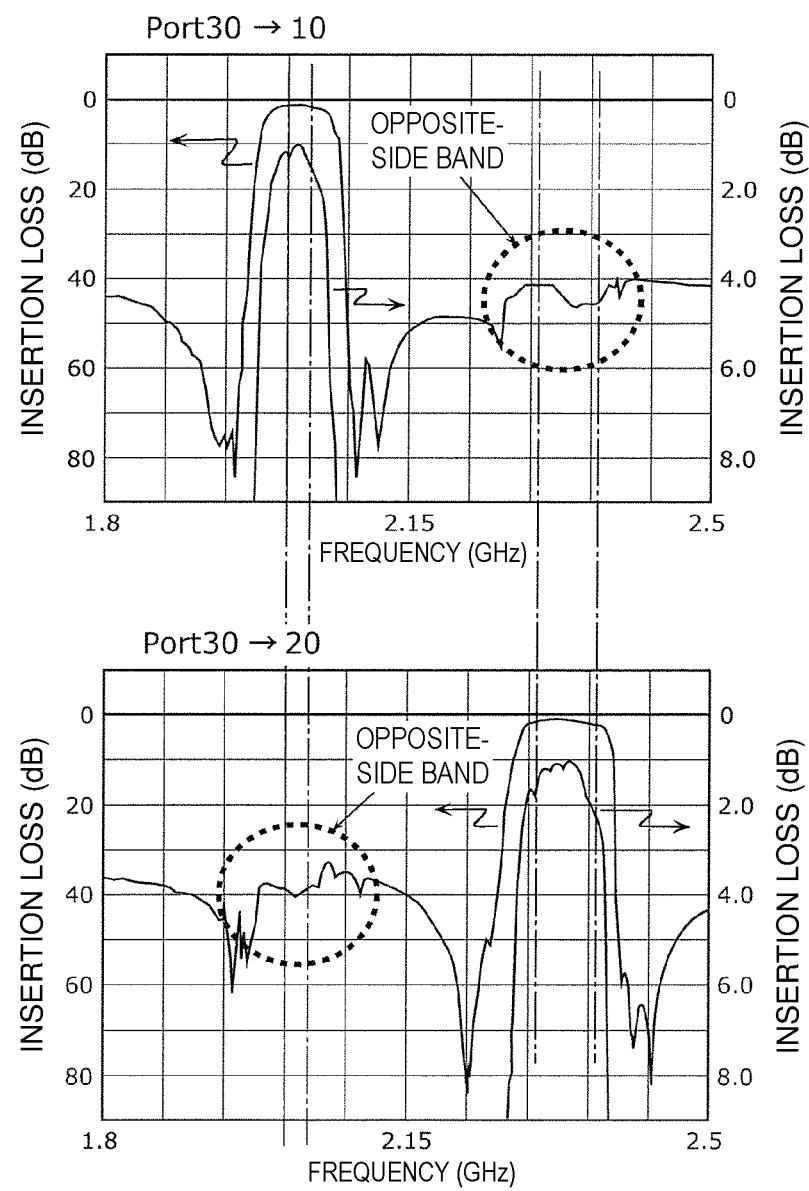
FIG. 4 includes graphs representing signal bandpass characteristics of the elastic wave filter device according to Preferred Embodiment 1 of the present invention.

FIG. 4 includes graphs representing signal bandpass characteristics of the elastic wave filter device 1 according to Preferred Embodiment 1. In the upper portion of FIG. 4, pass band characteristics between the input terminal 30 and the output terminal 10 of the reception filter 11 are shown, and in the lower portion of FIG. 4, pass band characteristics between the input terminal 30 and the output terminal 20 of the reception filter 12 are shown. In the bandpass characteristics of the reception filter (the upper graph in FIG. 4), not only bandpass characteristics in the pass band but also the attenuation characteristics in the pass band of the reception filter 12 (opposite-side band) are shown. In addition, in the bandpass characteristics of the reception filter 12 (the lower graph in FIG. 4), not only bandpass characteristics in the bass band but also the attenuation characteristics in the pass band of the reception filter 11 (opposite-side band) are shown.

Table 1 shows design parameters of the reception filters 11 and 12 according to Preferred Embodiment 1.

TABLE 1

|  | Overlap width (μm) | Pair number (pairs) | Wavelength (μm) |
| --- | --- | --- | --- |
| Reception filter 11 | | | |
| Series resonator 101 | 31.29 | 79 | 1.937 |
| Series resonator 102 | 39.57 | 71 | 1.941 |
| Series resonator 103 | 42.67 | 74 | 1.942 |
| Series resonator 104 | 42.67 | 74 | 1.942 |
| Series resonator 105 | 37.63 | 87 | 1.950 |
| Series resonator 106 | 32.06 | 69.5 | 1.917 |
| Parallel resonator 151 | 55.00 | 57 | 2.004 |
| Parallel resonator 152 | 95.78 | 54 | 2.018 |
| Parallel resonator 153 | 90.57 | 49.5 | 2.010 |
| Parallel resonator 154 | 30.96 | 26.5 | 1.998 |
| Reception filter 12 | | | |
| Series resonator 201 | 108.83 | 129 | 1.668 |
| Series resonator 202 | 31.73 | 105 | 1.650 |
| Series resonator 203 | 31.73 | 105 | 1.650 |
| Series resonator 204 | 29.51 | 92.5 | 1.627 |
| Series resonator 205 | 29.51 | 92.5 | 1.627 |
| Series resonator 206 | 49.20 | 117.5 | 1.666 |
| Series resonator 207 | 37.35 | 130 | 1.649 |
| Series resonator 208 | 37.35 | 130 | 1.649 |
| Parallel resonator 251 | 53.18 | 76 | 1.726 |
| Parallel resonator 252 | 41.38 | 44 | 1.704 |
| Parallel resonator 253 | 36.21 | 50 | 1.706 |
| Parallel resonator 254 | 45.98 | 57 | 1.739 |

Figure 5:
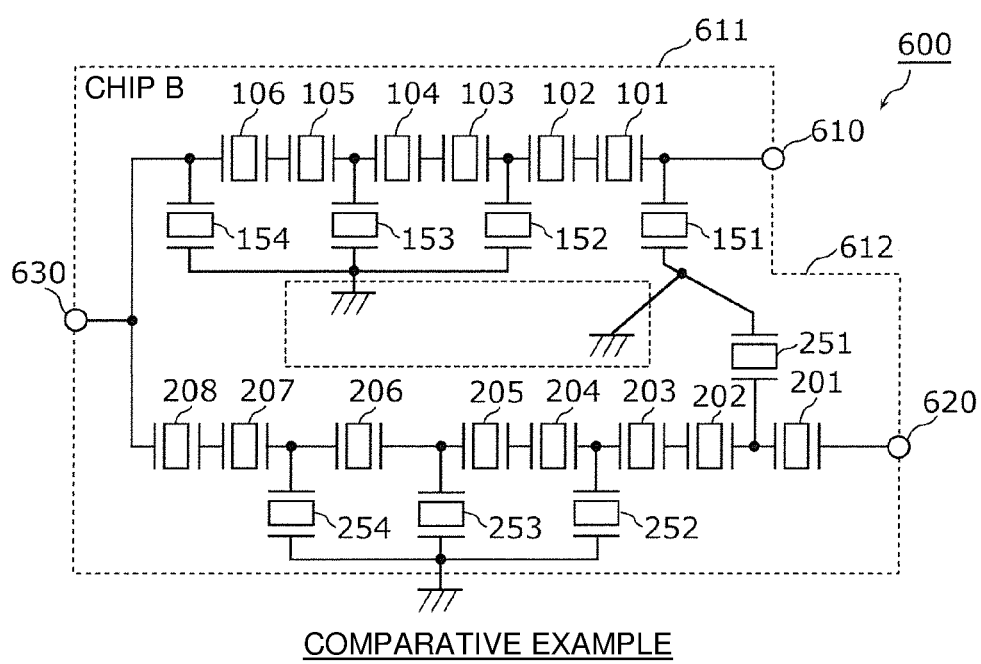
FIG. 5 is a circuit configuration diagram of an elastic wave filter device according to a comparative example.

FIG. 5 is a circuit configuration diagram of an elastic wave filter device 600 according to a comparative example. As shown in FIG. 5, the elastic wave filter device 600 includes reception filters 611 and 612, output terminals 610 and 620, and an input terminal 630. In the circuit configuration diagram shown in FIG. 5, a parallel resonator 151 connected so as to be closest to the output terminal 610 among parallel resonators included in the reception filter 611, and a parallel resonator 251 connected so as to be closest to the output terminal 620 among parallel resonators included in the reception filter 612, are connected (shared) to each other on a chip B. Thus, an unnecessary path for a high-frequency signal between the output terminal 610 and the output terminal 620 with the shortest distance is provided, so that leaking of a signal between the reception filter 611 and the reception filter 612 increases. The circuit configuration of the elastic wave filter device 600 according to the comparative example is the same or substantially the same as the circuit configuration of the elastic wave filter device 1 according to Preferred Embodiment 1, except for the connection configuration of the parallel resonator 151 and the parallel resonator 251 to a reference terminal.

Figure 6:
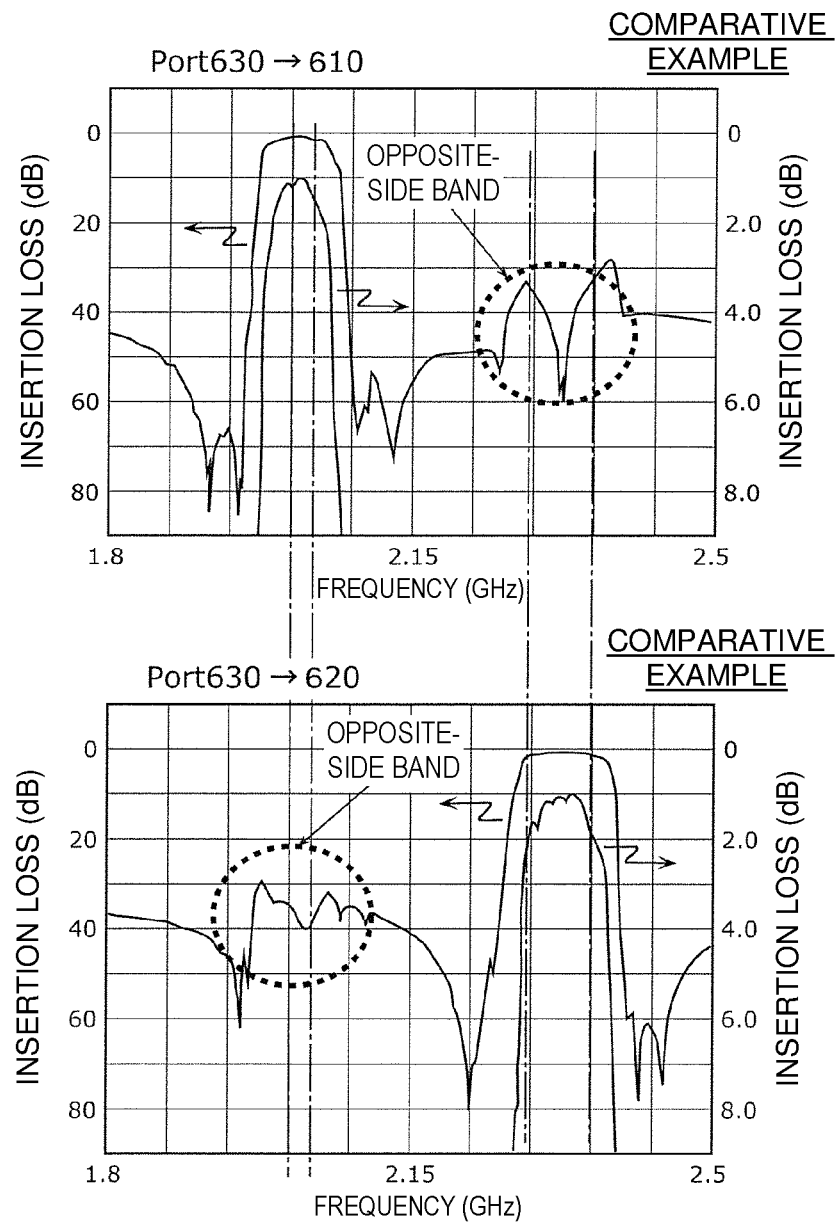
FIG. 6 is graphs representing signal bandpass characteristics of the elastic wave filter device according to the comparative example.

FIG. 6 includes graphs representing signal bandpass characteristics of the elastic wave filter device 600 according to the comparative example. In the upper portion in FIG. 6, pass band characteristics between the input terminal (shared terminal) 630 and the output terminal 610 of the reception filter 611 are shown, and in the lower portion, pass band characteristics between the input terminal 630 and output terminal 620 of the reception filter 612 are shown.

The bandpass characteristics (FIG. 4) of the elastic wave filter device 1 according to the present preferred embodiment and the bandpass characteristics (FIG. 6) of the elastic wave filter device 600 according to the comparative example are compared to each other. First, when the reception filter 11 and the reception filter 611 are compared to each other, insertion loss in each pass band is kept low. On the other hand, the attenuation in the opposite-side band for the reception filter 11 is equal to or greater than about 40 dB, the attenuation in the opposite-side band for the reception filter 611 is about 32 dB. Next, when the reception filter 12 and the reception filter 612 are compared to each other, insertion loss in each pass band is kept low. On the other hand, the attenuation in the opposite-side band for the reception filter 12 is about 38 dB, the attenuation in the opposite-side band for the reception filter 612 is about 34 dB.

According to the above comparison, the bandpass characteristics outside the band (the opposite-side band) of the elastic wave filter device 1 according to the present preferred embodiment are better than the bandpass characteristics outside the band (the opposite-side band) of the elastic wave filter device 600 according to the comparative example.

That is, according to the elastic wave filter device 1 according to the present preferred embodiment, it is possible to reduce the influence on the attenuation in the opposite-side band while two reception filters are provided in one chip. Thus, it is possible to obtain an elastic wave filter device that is reduced in size while a required attenuation outside a pass band is ensured.

As shown in FIG. 1, of the reference terminals connected to the parallel resonators, at least one set is preferably defined by one conductor pattern on the piezoelectric substrate 50. Specifically, in the elastic wave filter device 1 according to the present preferred embodiment, the reference terminal connected to the parallel resonators 152, 153, and 154 is shared as the reference terminal GND1. That is, the reference terminal connected to the parallel resonators 152, 153, and 154 is defined by one conductor pattern (GND1). In addition, the reference terminal connected to the parallel resonators 251, 252, and 254 is shared as the reference terminal GND2. That is, the reference terminal connected to the parallel resonators 251, 252, and 254 is defined by one conductor pattern (GND2). Moreover, the reference terminal connected to the parallel resonators 151 and 253 is shared as the reference terminal GND3. That is, the reference terminal connected to the parallel resonators 151 and 253 is defined by one conductor pattern (GND3).

Accordingly, since the two or more reference terminals are shared on the piezoelectric substrate 50, it is possible to reduce the area of the piezoelectric substrate 50 while blocking an unnecessary path for a high-frequency signal with the shortest distance via the reference terminal (GND3) and the reference terminal (GND2). Thus, it is possible to obtain the elastic wave filter device 1 that is reduced in size while a required attenuation outside a pass band is ensured.

Figure 7:
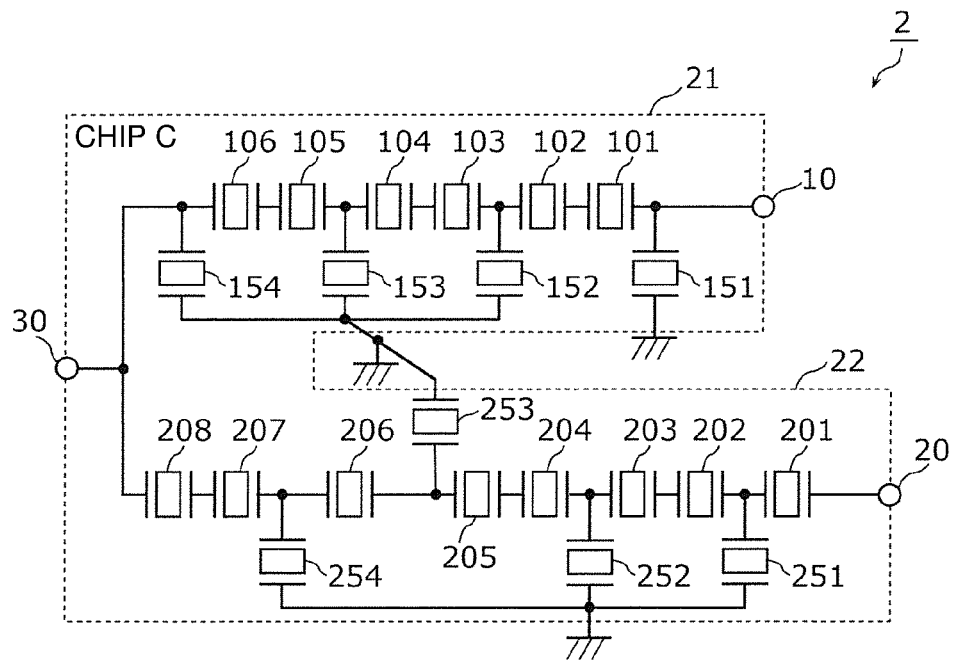
FIG. 7 is a circuit configuration diagram of an elastic wave filter device according to a modification of Preferred Embodiment 1 of the present invention.

FIG. 7 is a circuit configuration diagram of an elastic wave filter device 2 according to a modification of Preferred Embodiment 1. As shown in FIG. 7, the elastic wave filter device 2 includes reception filters 21 and 22, output terminals 10 and 20, and an input terminal 30. The elastic wave filter device 2 according to the present modification is different from the elastic wave filter device 1 according to Preferred Embodiment 1, only in the connection configurations of a plurality of reference terminals. Hereinafter, the description of the same or similar aspects as in the elastic wave filter device 1 according to Preferred Embodiment 1 is omitted, and only the differences therefrom will be primarily described.

In the elastic wave filter device 2 according to the present modification, the reference terminal (first reference terminal) connected to the parallel resonator 151 connected so as to be closest to the output terminal 10 among the parallel resonators included in the reception filter 21, and the reference terminal (second reference terminal) connected to the parallel resonator 251 connected so as to be closest to the output terminal 20 among the parallel resonators included in the reception filter 22, are separated from each other on the single piezoelectric substrate 50. This is the same or substantially the same as in the elastic wave filter device 1 according to Preferred Embodiment 1.

The reference terminal connected to the parallel resonators 152, 153, 154, and 253 is shared on a chip C. That is, the reference terminal connected to the parallel resonators 152, 153, 154, and 253 is defined by one conductor pattern. In addition, the reference terminal connected to the parallel resonators 251, 252, and 254 is shared on the chip C. That is, the reference terminal connected to the parallel resonators 251, 252, and 254 is defined by one conductor pattern.

That is, the difference from the elastic wave filter device 1 according to Preferred Embodiment 1 is that the first reference terminal is separated on the piezoelectric substrate 50 from any of the reference terminals connected to the parallel resonators 251 to 254 included in the reception filter 22 and the second reference terminal is separated on the piezoelectric substrate 50 from any of the reference terminals connected to the parallel resonators 151 to 154 included in the reception filter 21.

Accordingly, in addition to an unnecessary shortest path for a high-frequency signal via the first reference terminal and the second reference terminal, a signal path via the first reference terminal and the reference terminal of the reception filter 22 and a signal path via the second reference terminal and the reference terminal of the reception filter 21 are blocked between the output terminals 10 and 20, and thus, it is possible to more effectively reduce or prevent the occurrence of leaking of a signal between the filters. Thus, it is possible to reduce influence on the attenuation in the opposite-side band.

Preferred Embodiment 2

Whereas the first reference terminal and the second reference terminal connected to the parallel resonators 151 and 251 are separated from each other on the piezoelectric substrate in the elastic wave filter device according to Preferred Embodiment 1, an elastic wave filter device according to the present preferred embodiment has a configuration in which a first reference terminal and a second reference terminal are not shared with any of the other reference terminals.

Figure 8:
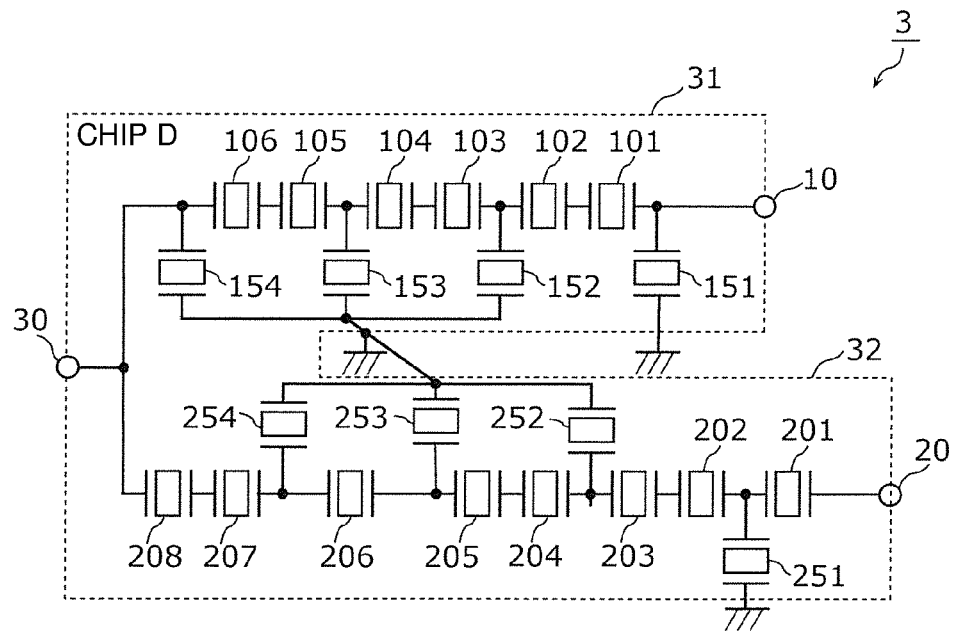
FIG. 8 is a circuit configuration diagram showing an elastic wave filter device according to Preferred Embodiment 2 of the present invention.

FIG. 8 is a circuit configuration diagram of an elastic wave filter device 3 according to Preferred Embodiment 2. As shown in FIG. 8, the elastic wave filter device 3 includes reception filters 31 and 32, output terminals 10 and 20, and an input terminal 30. The elastic wave filter device 3 according to the present preferred embodiment is different from the elastic wave filter device 1 according to Preferred Embodiment 1 only in the connection configurations of a plurality of reference terminals. Hereinafter, the description of the same aspects as in the elastic wave filter device 1 according to Preferred Embodiment 1 is omitted, and the differences therefrom will be primarily described.

In the elastic wave filter device 3 according to the present preferred embodiment, the reference terminal (first reference terminal) connected to the parallel resonator 151 connected so as to be closest to the output terminal 10 among the parallel resonators 151 to 154 included in the reception filter 31, and the reference terminal (second reference terminal) connected to the parallel resonator 251 connected so as to be closest to the output terminal 20 among the parallel resonators 251 to 254 included in the reception filter 32, are separated (insulated) from each other on the single piezoelectric substrate 50. This is the same or substantially the same as in the elastic wave filter device 1 according to Preferred Embodiment 1.

Each of the first reference terminal and the second reference terminal is separated (insulated) on a chip D from any of the other reference terminals on the piezoelectric substrate 50.

Accordingly, an unnecessary shortest path for a high-frequency signal via the first reference terminal and the second reference terminal is completely blocked between the output terminals 10 and 20, and thus, it is possible to more effectively reduce or prevent the occurrence of leaking of a signal between the filters as compared to the elastic wave filter device 1 according to Preferred Embodiment 1. Therefore, it is possible to reduce the influence on an attenuation in an opposite-side band.

The reference terminal connected to the parallel resonators 152, 153, 154, 252, 253, and 254 is shared on the chip D. That is, the reference terminal connected to the parallel resonators 152 to 154 and 252 and 254 is defined by one conductor pattern. In other words, the reference terminals other than the first reference terminal and the second reference terminal, among the plurality of reference terminals provided on the piezoelectric substrate 50, are defined by one conductor pattern on the piezoelectric substrate 50.

Accordingly, since all of the reference terminals other than the first reference terminal and the second reference terminal are shared on the piezoelectric substrate 50, it is possible to more effectively reduce the area of the piezoelectric substrate 50 while completely blocking an unnecessary shortest path for a high-frequency signal via the first reference terminal and the second reference terminal. Therefore, it is possible to obtain the elastic wave filter device 3 that is reduced in size while a required attenuation outside a pass band is ensured.

Figure 9:
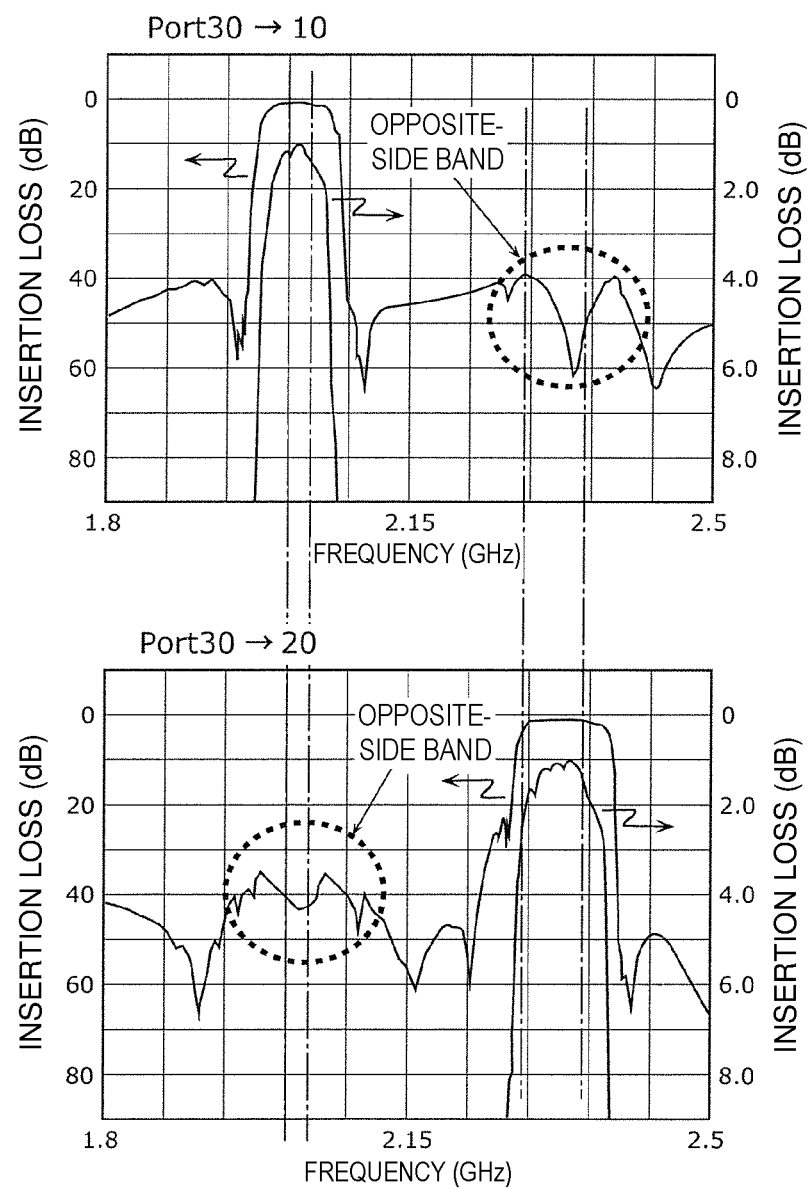
FIG. 9 includes graphs representing signal bandpass characteristics of the elastic wave filter device according to Preferred Embodiment 2 of the present invention.

FIG. 9 includes graphs representing signal bandpass characteristics of the elastic wave filter device 3 according to Preferred Embodiment 2. In the upper portion of FIG. 9, pass band characteristics between the input terminal 30 and the output terminal 10 of the reception filter 31 are shown, and in the lower portion of FIG. 9, pass band characteristics between the input terminal 30 and the output terminal 20 of the reception filter 32 are shown. In the bandpass characteristics of the reception filter (the upper graph in FIG. 9), not only bandpass characteristics in the pass band but also the attenuation characteristics in the pass band of the reception filter 32 (opposite-side band) are shown. In addition, in the bandpass characteristics of the reception filter 32 (the lower graph in FIG. 9), not only bandpass characteristics in the pass band but also the attenuation characteristics in the pass band of the reception filter 31 (opposite-side band) are shown.

The bandpass characteristics (FIG. 9) of the elastic wave filter device 3 according to the present preferred embodiment and the bandpass characteristics (FIG. 6) of the elastic wave filter device 600 according to the comparative example are compared to each other. First, when the reception filter 31 and the reception filter 611 are compared to each other, insertion loss in each pass band is kept low. On the other hand, whereas the attenuation in the opposite-side band for the reception filter 31 is equal to or greater than about 40 dB, the attenuation in the opposite-side band for the reception filter 611 is about 32 dB. Next, when the reception filter 32 and the reception filter 612 are compared to each other, insertion loss in each pass band is kept low. On the other hand, the attenuation in the opposite-side band for the reception filter 32 is about 41 dB, the attenuation in the opposite-side band for the reception filter 612 is about 34 dB.

According to the above comparison, the bandpass characteristics outside the band (the opposite-side band) of the elastic wave filter device 3 according to the present preferred embodiment are better than the bandpass characteristics outside the band (the opposite-side band) of the elastic wave filter device 600 according to the comparative example.

Furthermore, the bandpass characteristics (FIG. 9) of the elastic wave filter device 3 according to the present preferred embodiment and the bandpass characteristics (FIG. 4) of the elastic wave filter device 1 according to Preferred Embodiment 1 are compared to each other. First, when the reception filter 31 and the reception filter 11 are compared to each other, insertion loss in each pass band is kept low. On the other hand, whereas the attenuation in the opposite-side band for the reception filter 31 is equal to or greater than about 40 dB, the attenuation in the opposite-side band for the reception filter 11 is about 40 dB. Next, when the reception filter 32 and the reception filter 12 are compared to each other, insertion loss in each pass band is kept low. On the other hand, the attenuation in the opposite-side band for the reception filter 32 is about 41 dB, and the attenuation in the opposite-side band for the reception filter 12 is about 38 dB.

According to the above comparison, the bandpass characteristics outside the band (the opposite-side band) of the elastic wave filter device 3 according to the present preferred embodiment are better than the bandpass characteristics outside the band (the opposite-side band) of the elastic wave filter device 1 according to Preferred Embodiment 1. In the elastic wave filter device 3 according to the present preferred embodiment, it is possible to improve the attenuation outside the band as compared to the elastic wave filter device 1 according to Preferred Embodiment 1, because the first reference terminal and the second reference terminal are completely separated from the other reference terminals. However, in the elastic wave filter device 3 according to the present preferred embodiment, as compared to the elastic wave filter device 1 according to Preferred Embodiment 1, the configuration is different since all of the reference terminals other than the first reference terminal and the second reference terminal are shared on the chip, and there is a possibility that the attenuation characteristics deteriorate. Even considering this point, the configuration in which the first reference terminal and the second reference terminal are completely separated from the other reference terminals is considered to have a large effect on the attenuation characteristics outside the band.

Figure 10:
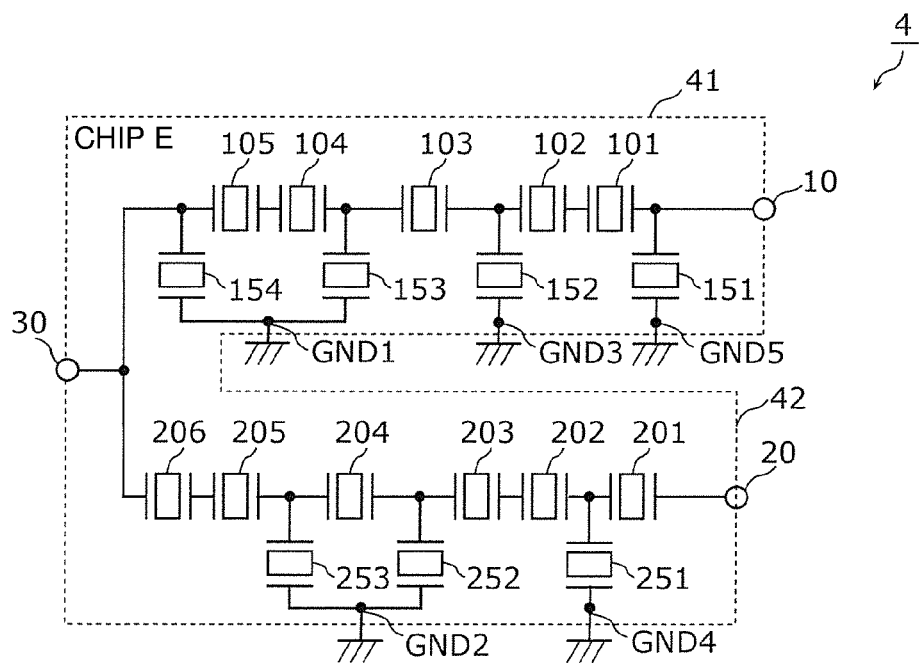
FIG. 10 is a circuit configuration diagram of an elastic wave filter device according to Modification 1 of Preferred Embodiment 2 of the present invention.

FIG. 10 is a circuit configuration diagram of an elastic wave filter device 4 according to Modification 1 of Preferred Embodiment 2. As shown in FIG. 10, the elastic wave filter device 4 includes reception filters 41 and 42, output terminals 10 and 20, and an input terminal 30. The elastic wave filter device 4 according to the present modification is different from the elastic wave filter device 3 according to Preferred Embodiment 2, only in the numbers of series resonators and parallel resonators and the connection configurations of a plurality of reference terminals. Hereinafter, the description of the same aspects as in the elastic wave filter device 3 according to Preferred Embodiment 2 is omitted, and only the differences therefrom will be primarily described.

The reception filter 41 is preferably a ladder first elastic wave filter that includes series resonators 101, 102, 103, 104, and 105 connected between the input terminal 30 (shared terminal) and the output terminal 10 (first terminal) and parallel resonators 151, 152, 153, and 154 connected between a connection path from the input terminal 30 to the output terminal 10 and one reference terminal of a plurality of reference terminals. The series resonators 101 to 105 and the parallel resonators 151 to 154 are each defined by a surface acoustic wave resonator.

The reception filter 42 is preferably a ladder second elastic wave filter that includes series resonators 201, 202, 203, 204, 205, and 206 connected between the input terminal 30 and the output terminal 20 (second terminal) and parallel resonators 251, 252, and 253 connected between a connection path from the input terminal 30 to the output terminal 20 and another reference terminal of the plurality of reference terminals. The series resonators 201 to 206 and the parallel resonators 251 to 253 are each defined by a surface acoustic wave resonator.

Figure 11:
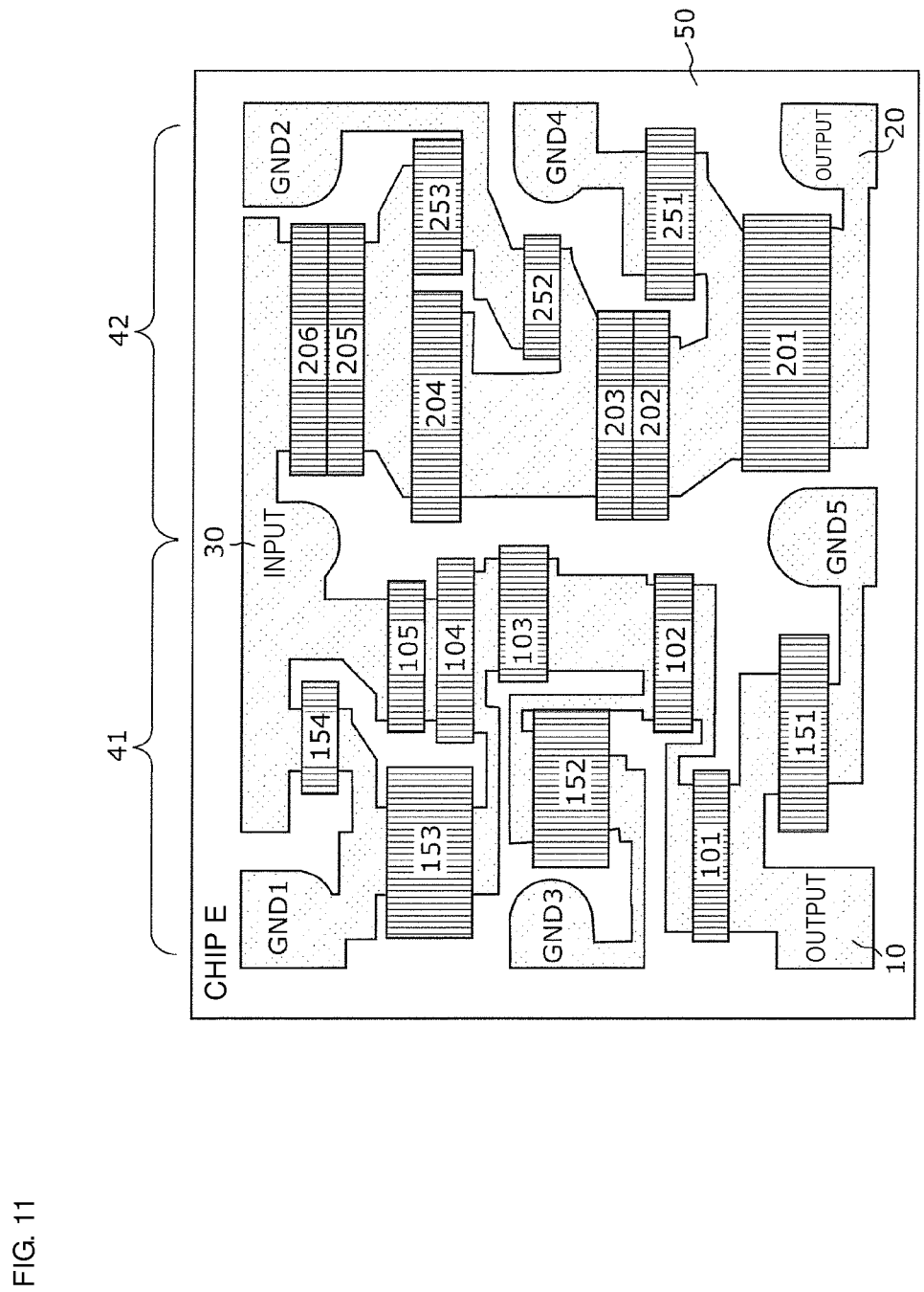
FIG. 11 is a chip layout diagram of the elastic wave filter device according to Modification 1 of Preferred Embodiment 2 of the present invention.

FIG. 11 is a chip layout diagram of the elastic wave filter device 4 according to Modification 1 of Preferred Embodiment 2. In FIG. 11, the arrangement configuration of the electrode layout of the reception filters 41 and 42 provided on the surface of the single piezoelectric substrate 50 is shown.

In FIG. 11, the reception filter 41 is disposed at the left half of the piezoelectric substrate 50, and the reception filter 42 is disposed at the right half of the piezoelectric substrate 50. The respective resonators shown in FIG. 10 are disposed such that directions in which a high-frequency signal propagates (right-left directions in FIG. 11) coincide with each other. In addition, an electrode wire electrically connecting each resonator, the input terminal 30, and the output terminals 10 and 20 is provided on the piezoelectric substrate 50 such that the circuit configuration shown in FIG. 10 is achieved. The material used for the electrode wire is preferably the same as the material used for each resonator (the IDT electrode 54 in FIG. 2).

In addition to the input terminal 30 and the output terminals 10 and 20, reference terminals GND1, GND2, GND3, GND4, and GND5 are disposed on the piezoelectric substrate 50 shown in FIG. 11. The reference terminals GND1 to GND5 are separated (insulated) from each other on a chip E of the piezoelectric substrate 50 and are grounded outside the chip E via external wires. In the present modification, the reference terminal GND1 is connected to the parallel resonators 153 and 154, the reference terminal GND2 is connected to the parallel resonators 252 and 253, the reference terminal GND3 is connected to the parallel resonator 152, the reference terminal GND4 is connected to the parallel resonator 251, and the reference terminal GND5 is connected to the parallel resonator 151.

In the elastic wave filter device 4 according to the present modification, the reference terminal GND5 (first reference terminal) connected to the parallel resonator 151 connected so as to be closest to the output terminal 10 among the parallel resonators 151 to 154 included in the reception filter 41, and the reference terminal GND4 (second reference terminal) connected to the parallel resonator 251 connected so as to be closest to the output terminal 20 among the parallel resonators 251 to 253 included in the reception filter 42, are separated (insulated) from each other on the piezoelectric substrate 50. This is the same or substantially the same as in the elastic wave filter device 3 according to Preferred Embodiment 2.

The elastic wave filter device 4 according to the present modification is different from the elastic wave filter device 3 according to Preferred Embodiment 2 in the following aspects. The number of the series resonators of the reception filter 41 is smaller and the numbers of the series resonators and the parallel resonators of the reception filter 42 are smaller. In addition, the number of reference terminals disposed on the chip E is preferably increased to five, for example. Moreover, all of the reference terminals other than GND5 (first reference terminal) and GND4 (second reference terminal) are not shared on the chip E.

The configuration in which the number of the reference terminals disposed on the chip E is increased to five is possible by, for example, disposing eight electrode terminals, that is, the input terminal 30, the output terminals 10 and 20, and the reference terminals GND1 to GND 5, such that three terminals are located at each side of the outer periphery of the chip E as shown in FIG. 11. In FIG. 11, the reference terminal GND1, the input terminal 30, and the reference terminal GND2 are disposed at the upper side of the chip E in order from left to right. In addition, the reference terminal GND1, the reference terminal GND3, and the output terminal 10 are disposed at the left side of the chip E in order from top to bottom. Moreover, the reference terminal GND2, the reference terminal GND4, and the output terminal 20 are disposed at the right side of the chip E in order from top to bottom. Furthermore, the output terminal 10, the reference terminal GND5, and the output terminal 20 are disposed at the lower side of the chip E in order from left to right.

With the above configuration, an unnecessary shortest path for a high-frequency signal via the first reference terminal and the second reference terminal is completely blocked between the output terminals 10 and 20, and thus, it is possible to more effectively reduce or prevent the occurrence of leaking of a signal between the filters as compared to the elastic wave filter device 1 according to Preferred Embodiment 1. Therefore, it is possible to reduce the influence on an attenuation in an opposite-side band.

The reference terminal GND1 connected to the parallel resonators 153 and 154 is shared on the chip E. That is, the reference terminal GND1 connected to the parallel resonators 153 and 154 is defined by one conductor pattern. In addition, the reference terminal GND2 connected to the parallel resonators 252 and 253 is shared on the chip E. That is, the reference terminal GND2 connected to the parallel resonators 252 and 253 is defined by one conductor pattern.

Accordingly, since each of the reference terminal GND1 and the reference terminal GND2 is a reference terminal shared on the piezoelectric substrate 50, it is possible to reduce the area of the piezoelectric substrate 50 while completely blocking an unnecessary shortest path for a high-frequency signal via the reference terminal GND5 (first reference terminal) and the reference terminal GND4 (second reference terminal). Therefore, it is possible to obtain the elastic wave filter device 4 that is reduced in size while a required attenuation outside a pass band is ensured.

The elastic wave filter devices according to preferred embodiments of the present invention are not limited to one including a plurality of ladder surface acoustic wave filters.

Figure 12:
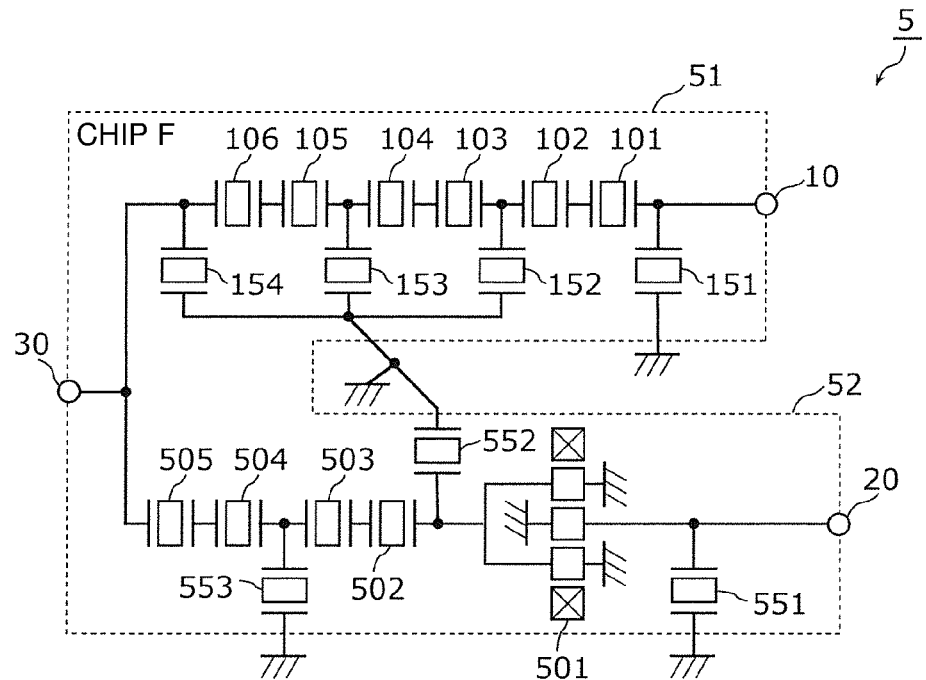
FIG. 12 is a circuit configuration diagram of an elastic wave filter device according to Modification 2 of Preferred Embodiment 2 of the present invention.
Figure 13:
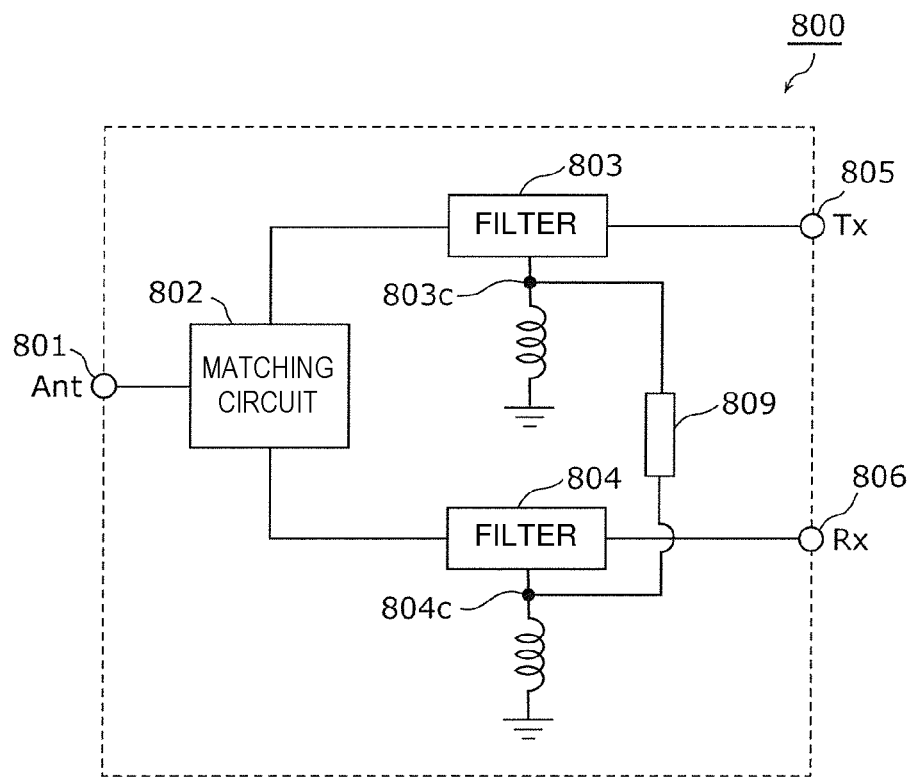
FIG. 13 is a block diagram of a demultiplexer disclosed in Japanese Unexamined Patent Application Publication No. 2005-124139.

FIG. 12 is a circuit configuration diagram of an elastic wave filter device 5 according to Modification 2 of Preferred Embodiment 2. As shown in FIG. 12, the elastic wave filter device 5 includes reception filters 51 and 52, output terminals 10 and 20, and an input terminal 30. The elastic wave filter device 5 according to the present modification is different from the elastic wave filter device 3 according to Preferred Embodiment 2, only in that the reception filter 52 is a longitudinally coupled surface acoustic wave filter. Hereinafter, the description of the same points as in the elastic wave filter device 3 according to Preferred Embodiment 2 is omitted, and only the differences therefrom will be mainly described.

The reception filter 52 is preferably a longitudinally coupled second elastic wave filter that includes a longitudinally coupled resonator 501 and series resonators 502, 503, 504, and 505 connected between the input terminal 30 (shared terminal) and the output terminal 20 (second terminal) and parallel resonators 551, 552, and 553 connected between a connection path from the input terminal 30 to the output terminal 20 and another reference terminal of a plurality of reference terminals, respectively. The resonator 501, the series resonators 502 to 505, and the parallel resonators 551 to 553 are each defined by a surface acoustic wave resonator.

The resonator 501 preferably includes three IDT electrodes and reflectors disposed at both ends of the three IDT electrodes, for example. The three IDT electrodes of the resonator 501 are the same or substantially the same as shown in FIG. 2.

Here, in the elastic wave filter device 5 according to the present modification, the reference terminal (first reference terminal) connected to the parallel resonator 151 connected so as to be closest to the output terminal 10 among the parallel resonators included in the reception filter 51, and the reference terminal (second reference terminal) connected to the parallel resonator 551 connected so as to be closest to the output terminal 20 among the parallel resonators included in the reception filter 52, are separated (insulated) from each other on the single piezoelectric substrate 50. This is the same or substantially the same as in the elastic wave filter device 3 according to Preferred Embodiment 2.

The reference terminal connected to the parallel resonators 152, 153, 154, and 552 is shared on a chip F. That is, the reference terminal connected to the parallel resonators 152, 153, 154, and 552 is defined by one conductor pattern.

Accordingly, since the reference terminal connected to the parallel resonators 152, 153, 154, and 552 is shared on the piezoelectric substrate 50, it is possible to effectively reduce the area of the piezoelectric substrate 50 while completely blocking an unnecessary shortest path for a high-frequency signal via the first reference terminal and the second reference terminal. Therefore, it is possible to obtain the elastic wave filter device 5 that is reduced in size while a required attenuation outside a pass band is ensured.

Although the elastic wave filter devices according to the preferred embodiments of the present invention have been described using configuration examples including two reception filters, the present invention is not limited to the above preferred embodiments and the modifications thereof. For example, modes obtained by modifying the above preferred embodiments and the modifications thereof as follows may also be included in the present invention.

For example, in the above preferred embodiment, 50° Y-cut X-propagation $LiTaO_3$ single crystal is described as an example of the piezoelectric substrate 50, but the single crystal material is not limited to $LiTaO_3$, and the cut-angles of the single crystal material are also not limited thereto.

The piezoelectric substrate 50, which defines a portion of the surface acoustic wave filter, may have a multilayer structure in which a high-acoustic-velocity support substrate, a low-acoustic-velocity film, and a piezoelectric film are laminated in this order. The piezoelectric film is preferably made of, for example, 50° Y-cut X-propagation LiTaO$_3$ piezoelectric single crystal or piezoelectric ceramics (lithium tantalite single crystal that is cut by a plane having a normal line that is an axis rotated about 50° from a Y axis about an X axis and in which a surface acoustic wave propagates in the X-axis direction, or ceramics). The piezoelectric film preferably has a thickness of about 600 nm, for example. The high-acoustic-velocity support substrate supports the low-acoustic-velocity film, the piezoelectric film, and the IDT electrode 54. The high-acoustic-velocity support substrate further makes the acoustic velocity of a bulk wave in the high-acoustic-velocity support substrate higher than that of an elastic wave such as a surface acoustic wave or a boundary wave propagating on the piezoelectric film, and encloses a surface acoustic wave in a portion in which the piezoelectric film and the low-acoustic-velocity film are laminated, such that the surface acoustic wave is prevented from leaking below the high-acoustic-velocity support substrate. The high-acoustic-velocity support substrate is preferably, for example, a silicon substrate and has, for example, a thickness of about 200 μm, for example. The low-acoustic-velocity film makes the acoustic velocity of a bulk wave in the low-acoustic-velocity film lower than that of a bulk wave propagating in the piezoelectric film, and is disposed between the piezoelectric film and the high-acoustic-velocity support substrate. Due to this structure and the characteristic that energy is concentrated on a medium in which the acoustic velocity of an elastic wave is relatively low, the energy of a surface acoustic wave is prevented from leaking outside the IDT electrode. The low-acoustic-velocity film preferably, for example, includes silicon dioxide as a main component, and has, for example, a thickness of about 670 nm. According to this multilayer structure, it is possible to significantly increase the Q-value at the resonant frequency and the anti-resonant frequency as compared to a structure in which the piezoelectric substrate 50 is used as a single layer. That is, it is possible to provide a surface acoustic wave resonator having a high Q-value, and thus, it is possible to provide a filter having low insertion loss by using the surface acoustic wave resonator.

A circuit element, such as an inductance element or a capacitance element, may preferably be included in order to provide impedance matching among the plurality of surface acoustic wave filters, for example, an impedance matching inductance element may be connected to the input terminal 30 side of the reception filters 11 and 12. Accordingly, the case in which the Q-values of the respective resonators are equivalently decreased is expected. However, even in such a case, according to the multilayer structure of the piezoelectric substrate, it is possible to maintain the Q-values of the respective resonators at high values. Thus, it is possible to provide a surface acoustic wave filter having low-loss properties in the band thereof.

The high-acoustic-velocity support substrate may preferably have a structure in which a support substrate and a high-acoustic-velocity film that makes the acoustic velocity of a bulk wave propagating therein higher than that of an elastic wave such as a surface acoustic wave or a boundary wave propagating on the piezoelectric film are laminated. In this case, as the support substrate, sapphire, piezoelectric materials such as lithium tantalate, lithium niobate, and quartz, various ceramics such as alumina, magnesia, silicon nitride, aluminum nitride, silicon carbide, zirconia, cordierite, mullite, steatite, and forsterite, dielectrics such as glass, semiconductors such as silicon and gallium nitride, resin substrates, and other suitable materials may preferably be used. In addition, as the high-acoustic-velocity film, various high-acoustic-velocity materials such as aluminum nitride, aluminum oxide, silicon carbide, silicon nitride, silicon oxynitride, a DLC film, or diamond, media including the above materials as a main component, and media including mixtures of the above materials as a main component, may preferably be used.

In the elastic wave filter devices 1 to 5 according to preferred embodiments of the present invention, an inductance element or a capacitance element may preferably be connected between the input terminal 30 and the output terminals 10 and 20.

The elastic wave filter devices according to preferred embodiments of the present invention may preferably include a transmission SAW filter defining a duplexer. That is, a first elastic wave filter may be one of a reception filter that filters a high-frequency signal inputted through the shared terminal, in a first pass band and outputs the filtered signal to the first terminal, and a transmission filter that filters a high-frequency signal inputted from the second terminal, in a second pass band and outputs the filtered signal to the shared terminal, and a second elastic wave filter may be the other of the reception filter and the transmission filter. In addition, the elastic wave filter devices according to preferred embodiments of the present invention may preferably include three or more SAW filters defining a multiplexer.

In the above-described preferred embodiments and the modifications thereof, the surface acoustic wave filter including the IDT electrode 54 has been described as an example of a reception filter that defines a portion of an elastic wave filter device. However, each filter that defines a portion of the elastic wave filter device according to a preferred embodiment of the present invention may be an elastic wave filter that includes series resonators and parallel resonators and that uses a boundary acoustic wave or a BAW (Bulk Acoustic Wave). Due to this, the same or substantially the same advantageous effects as those of the elastic wave filter devices according to the above-described preferred embodiments and the modifications thereof are achieved.

Preferred embodiments of the present invention are widely usable as small-sized dual filters, duplexers, and multiplexers having high attenuation characteristics applicable to a multiband feature and a multimode feature, in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave filter device comprising:
a first elastic wave filter and a second elastic wave filter having pass bands different from each other and provided on a piezoelectric substrate; and
a shared terminal, a first terminal, a second terminal, and a plurality of reference terminals provided on the piezoelectric substrate; wherein
the first elastic wave filter includes a series resonator connected between the shared terminal and the first terminal and parallel resonators connected between a connection path from the shared terminal to the first terminal and one reference terminal among the plurality of reference terminals;

the second elastic wave filter includes parallel resonators connected between a connection path from the shared terminal to the second terminal and another reference terminal among the plurality of reference terminals;

a first reference terminal among the plurality of reference terminals connected to a parallel resonator connected so as to be closest to the first terminal among the parallel resonators included in the first elastic wave filter, and a second reference terminal among the plurality of reference terminals connected to a parallel resonator connected so as to be closest to the second terminal among the parallel resonators included in the second elastic wave filter, are separated from each other on the piezoelectric substrate; and the first reference terminal is provided at a first side of the piezoelectric substrate, and the second reference terminal is provided at a second side of the piezoelectric substrate that is different than the first side of the piezoelectric substrate.

2. The elastic wave filter device according to claim 1, wherein each of the first reference terminal and the second reference terminal is separated on the piezoelectric substrate from any other reference terminals of the plurality of reference terminals on the piezoelectric substrate.

3. The elastic wave filter device according to claim 1, wherein
the first reference terminal is separated on the piezoelectric substrate from any of the reference terminals connected to the parallel resonators included in the second elastic wave filter; and
the second reference terminal is separated on the piezoelectric substrate from any of the reference terminal connected to the parallel resonators included in the first elastic wave filter.

4. The elastic wave filter device according to claim 1, wherein at least one set of reference terminals among the plurality of reference terminals is shared on the piezoelectric substrate.

5. The elastic wave filter device according to claim 1, wherein all of the reference terminals other than the first reference terminal and the second reference terminal, among the plurality of reference terminals, are shared on the piezoelectric substrate.

6. The elastic wave filter device according to claim 1, wherein
the first elastic wave filter is a first reception filter that filters a first high-frequency signal input through the shared terminal, in a first pass band and outputs the filtered signal to the first terminal; and
the second elastic wave filter is a second reception filter that filters a second high-frequency signal input through the shared terminal, in a second pass band and outputs the filtered signal to the second terminal.

7. The elastic wave filter device according to claim 1, wherein the first elastic wave filter and the second elastic wave filter are ladder surface acoustic wave filters.

8. The elastic wave filter device according to claim 7, wherein each of the first and second ladder surface acoustic wave filters includes an IDT electrode having a multilayer structure including a close contact layer and a main electrode layer.

9. The elastic wave filter device according to claim 8, wherein the close contact layer is made of Ti.

10. The elastic wave filter device according to claim 8, wherein the main electrode in made of Al including about 1% of Cu.

11. The elastic wave filter device according to claim 8, wherein each of the first and second ladder surface acoustic wave filters further includes a protective layer covering the IDT electrode.

12. A duplexer comprising the elastic wave filter device according to claim 1, wherein
the first elastic wave filter is one of a reception filter that filters a high-frequency signal input through the shared terminal, in a first pass band and outputs the filtered signal to the first terminal and a transmission filter that filters a high-frequency signal input through the second terminal, in a second pass band and outputs the filtered signal to the shared terminal; and
the second elastic wave filter is the other of the reception filter and the transmission filter.

13. The duplexer according to claim 12, wherein each of the first reference terminal and the second reference terminal is separated on the piezoelectric substrate from any other reference terminals of the plurality of reference terminals on the piezoelectric substrate.

14. The duplexer according to claim 12, wherein
the first reference terminal is separated on the piezoelectric substrate from any of the reference terminals connected to the parallel resonators included in the second elastic wave filter; and
the second reference terminal is separated on the piezoelectric substrate from any of the reference terminal connected to the parallel resonators included in the first elastic wave filter.

15. The duplexer according to claim 12, wherein at least one set of reference terminals among the plurality of reference terminals is shared on the piezoelectric substrate.

16. The duplexer according to claim 12, wherein the reference terminals other than the first reference terminal and the second reference terminal, among the plurality of reference terminals, are shared on the piezoelectric substrate.

17. The duplexer according to claim 12, wherein the first elastic wave filter and the second elastic wave filter are ladder surface acoustic wave filters.

18. The duplexer according to claim 17, wherein each of the first and second ladder surface acoustic wave filters includes an IDT electrode having a multilayer structure including a close contact layer and a main electrode layer.

19. The duplexer according to claim 18, wherein the close contact layer is made of Ti.

20. The duplexer according to claim 18, wherein the main electrode in made of Al including about 1% of Cu.

* * * * *